United States Patent [19]

Yamawaki

[11] Patent Number: 4,980,735
[45] Date of Patent: Dec. 25, 1990

[54] SOLID STATE IMAGING ELEMENT
[75] Inventor: Masao Yamawaki, Itami, Japan
[73] Assignee: Mitsubishi Denki Kabushiki Kaisha, Japan
[21] Appl. No.: 416,522
[22] Filed: Oct. 3, 1989
[30] Foreign Application Priority Data Oct. 7, 1988 [JP] Japan ................................ 63-254344

[51] Int. Cl.⁵ ............................................ H01L 29/78
[52] U.S. Cl. .................. 357/24; 357/24 LR; 357/24 M; 357/30; 358/213.16
[58] Field of Search ................ 358/213.15, 213.16, 358/213.19, 213.23, 213.26, 213.29; 357/32, 24, 24 LR, 24 M, 30 D, 30 I, 30 G, 30 H, 30 P, 30 S, 30 F

[56] References Cited

U.S. PATENT DOCUMENTS

| 4,389,661 | 6/1983 | Yamada | 357/24 LR |
| 4,447,735 | 5/1984 | Horii | 357/30 Q |
| 4,554,571 | 11/1985 | Arques | 357/24 |
| 4,597,013 | 6/1986 | Matsumoto | 357/24 LR |
| 4,618,874 | 10/1986 | Yamada | 357/24 |
| 4,716,466 | 12/1987 | Miida et al. | 358/213.26 |
| 4,724,470 | 2/1988 | Van Santen et al. | 357/24 M |
| 4,788,592 | 11/1988 | Yamawaki et al. | 358/213.29 |
| 4,794,279 | 12/1988 | Yamamura et al. | 357/24 LR |
| 4,866,496 | 9/1989 | Audier | 357/24 LR |
| 4,907,050 | 3/1990 | Yamada | 357/24 LR |

FOREIGN PATENT DOCUMENTS

| 0044712 | 3/1980 | Japan | 357/24 LR |
| 0163882 | 12/1980 | Japan | 357/24 LR |
| 57-28232 | 6/1982 | Japan | 357/24 |
| 0106177 | 7/1982 | Japan | 357/30 D |
| 0181275 | 11/1982 | Japan | 358/213.29 |
| 0198773 | 10/1985 | Japan | 357/30 S |
| 0076669 | 4/1987 | Japan | 357/24 LR |
| 62-230273 | 10/1987 | Japan | 357/24 |
| 62-265757 | 11/1987 | Japan | 357/24 LR |
| 62-269353 | 11/1987 | Japan | 357/24 LR |
| 0296463 | 12/1987 | Japan | 357/24 LR |
| 0296268 | 12/1988 | Japan | 357/24 |

OTHER PUBLICATIONS

Sekine et al., "CCD Linear Image Sensor", Toshiba Review, No. 127, 6/1980.
Monoi et al., "Improvement of Image ... Elements", Presented at the National Meeting of Society of Television Engineers in 1984.

Primary Examiner—Andrew J. James
Assistant Examiner—Minh Loan Tran
Attorney, Agent, or Firm—Leydig, Voit & Mayer

[57] ABSTRACT

A solid state imaging element includes a first conductivity type semiconductor substrate, a light-electricity conversion section for generating electrical charges in response to incident light including a second conductivity type layer disposed in the semiconductor substrate, a charge storage section having a layer of the second conductivity type disposed in the substrate for storing signal charges from the light-electricity conversion, transfer section for transferring signal charges from the storatge section, a first conductivity type layer disposed at the surface of substrate over the light-electricity conversion section and the charge storage section, and a light shielding film covering the transfer section wherein the concentration of dopant impurities in the charge storage section is higher than that in the light-electricity conversion section.

10 Claims, 4 Drawing Sheets

SOLID STATE IMAGING ELEMENT

FIELD OF THE INVENTION

The present invention relates to a solid state imaging element and, more particularly, to reducing the dark current in a solid state imaging element.

BACKGROUND OF THE INVENTION

FIG. 5(a) shows a cross-section of a conventional solid state imaging element having a light detector (hereinafter referred to as a photodiode) and a charge storage section in which charge skimming takes place.

In FIG. 5, reference numeral 8 designates a P type semiconductor substrate. An N type region 1 having a dopant impurity concentration of $N_1$ for producing a photodiode 10 is disposed in the P type semiconductor substrate 8. A surface P+ layer 2 is disposed on the N type impurity diffusion layer 1 so that photodiode 10 is buried to reduce the dark current. An N type layer 3 having a dopant impurity concentration of $N_2$ which produces a buried type CCD (Charge Coupled Device) is disposed on the surface of the semiconductor substrate 8. A barrier gate 4 is provided for applying a bias to the photodiode 10. A storage gate 5 is provided for producing a storage section 20. A reading out electrode (shift gate) 6 is provided for transferring charges from the storage section 20 to the CCD 30. Reference numeral 7 designates a transfer electrode of the CCD 30.

FIG. 5(b) shows a potential diagram for explaining the operation of the device of FIG. 5(a).

The device will operate as follows.

When light is incident on the photodiode section 10, signal charges are generated. Because electrons flow toward a lower potential, when a voltage is applied to the barrier gate 4 and a voltage smaller than the barrier gate voltage is applied to the storage gate 5, signal charges generated at the photodiode section 10 are transferred to and stored at the storage section 20 through the barrier gate 4. In FIG. 5(b), reference character $Q_{sig}$ designates stored signal charges. After a predetermined storage time has passed, a voltage higher than the storage gate voltage is applied to the shift gate 6 thereby to read out the signal charges $Q_{sig}$ to the CCD 30 through the shift gate 6. These signal charges are successively transferred to be output.

In an image sensor which operates in such storage mode, the dark current component is superimposed on the signal charges as noise, and variations in the dark current become fixed pattern noises, thereby reducing the uniformity of the signal charges. A dark current component due to crystal defects at the surface of semiconductor can be considered as the cause of the dark current. This current arises from charge carriers produced by dopant impurities that recombine at surface defects. In order to reduce that phenomenon, usually a shallow P+ layer 2 is disposed at the surface of N type layer 1 having a dopant impurity concentration of $N_1$, and the photodiode 10 is thus buried in silicon. However, in an image sensor which, having such photodiode section 10 and storage section 20, employs charge skimming, even if the dark current of the photodiode section 10 is reduced, the dark current component generated at the storage section 20 opposite the barrier gate 4 and the storage gate 5 will be superimposed on the signal charges, thereby reducing the imaging characteristics.

In the prior art solid state imaging element employing charge skimming, it is quite difficult to reduce the dark current generating at the storage section 20. Reduction of the dark current is limited by the structure of the storage section 20.

SUMMARY OF THE INVENTION

An object of the present invention is to provide a solid state imaging element having reduced dark current generation at the light electricity conversion section and reduced dark current generation at the storage section.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a light-electricity conversion section and a storage section are buried in a silicon substrate, a light shielding film is disposed at the storage section and the charge transfer section, and the impurity concentration of the storage section is higher than that of the light-electricity conversion section. Accordingly, it is possible to reduce not only the dark current generation at the light-electricity conversion section but also at the storage section. As a result, signal charges produced by light-electricity conversion can be read out with high precision.

DETAILED DESCRIPTION OF THE PREFERRED EMBODIMENTS

An embodiment of the present invention will be described in detail with reference to the drawings.

Figure 1A:
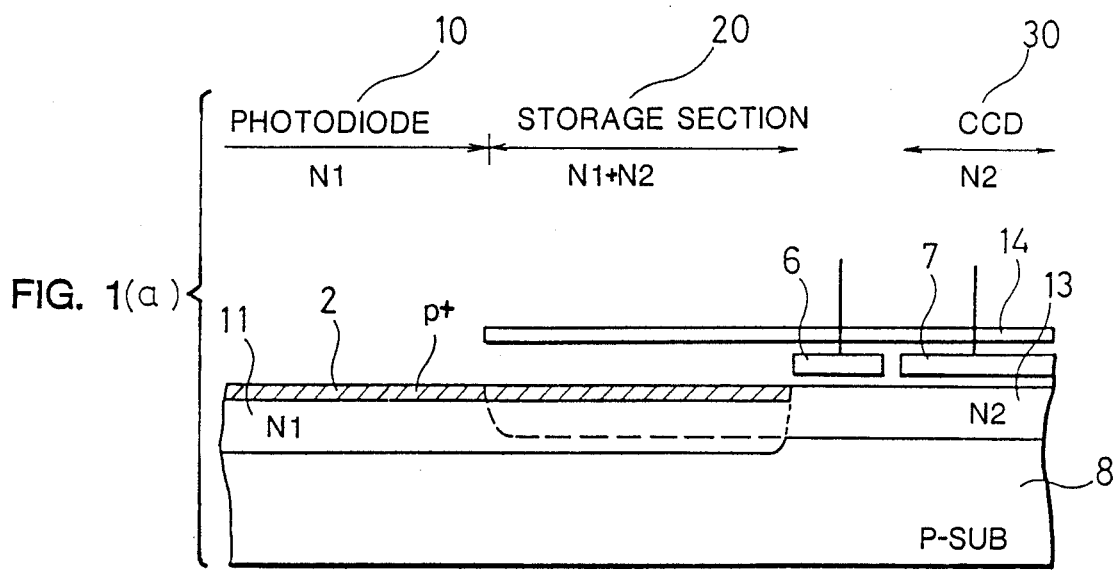
FIG. 1(a) is a cross-sectional view of a solid state imaging element according to a first embodiment of the present invention and FIG. 1(b) is a potential diagram for explaining the operation of the device of FIG. 1(a)
Figure 1B:
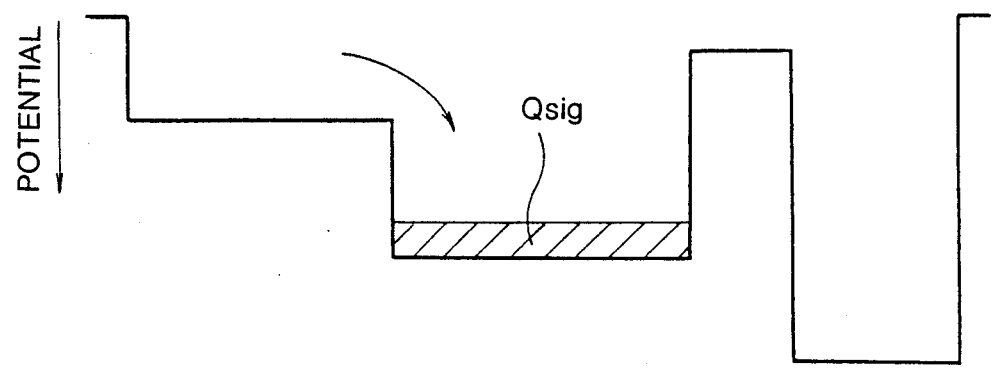

FIG. 1(a) shows a cross-section of a solid state imaging element according to a first embodiment of the present invention and FIG. 1(b) is a potential diagram for explaining the operation of the device of FIG. 1(a).

In FIG. 1(a), an N type layer 11 having a dopant impurity concentration of $N_1$ is disposed on a p type semiconductor substrate 8. A photodiode section 10 for light to electricity conversion and a storage section 20 for storing signal charges generated at the photodiode section 10 are disposed continuously with each other. A CCD section 30 is provided for transferring signal charges stored at the storage section 20. The concentration of N type dopant impurities in the photodiode section 10 is $N_1$ and the concentration of N type dopant impurities in the buried channel of CCD section 30 is $N_2$, and the impurity concentration of the storage section 20 is $N_1 + N_2$. Because the dopant impurity concentration of the storage section 20 is higher than that of the photodiode section 10, the potential of the storage section 20 is lower than that of the photodiode section 10 as shown in FIG. 1(b). A light shielding film 14 comprising aluminum is disposed covering the storage section 20 and the CCD section 30. Signal charges generated by the light incident to the photodiode section 10 are collected at the storage section 20 having a lower potential than that of the photodiode section 10.

In FIG. 1(b), reference character $Q_{sig}$ designates stored signal charges. After an integration time has passed, a voltage for making the voltage of the shift gate 6 higher than that of the storage section 20 is applied to the shift gate 6, and then signal charges $Q_{sig}$ are transferred to the CCD 20 through the shift gate 6. In this series of operations, the potential of the storage section 20 is required to be lower than that of the photodiode section 10. When the potential of the photodiode section 10 is lower than that of the storage section 20, there is no place for storing signal charges. When the depth of the potential well of the storage section 20 is not sufficiently deeper than the potential of the photodiode section 10, the charge storage capacitance is reduced.

In this embodiment, since a surface P+ layer 2 is disposed at the surface of storage section 20 as well as at the surface of light-electricity conversion section 10, and the light-electricity conversion section 10 and the storage section 20 are buried in the semiconductor substrate 8, the dark current generation at the substrate surface can be reduced and the element performance can be enhanced.

Because the area of the light-electricity conversion section 10 is larger than the area of the storage section 20, even when light is incident on the storage section 20, the contribution of signals generation at the storage section 20 is usually low. However, because a light shielding film 14, such as aluminum covers the storage section 20 and the charge transfer section 30, generation of signals at the storage section 20 can be perfectly suppressed and the imaging characteristics of the element can be further improved.

In the above illustrated embodiment in which a region having N type dopant impurities of concentration $N_1$ and a region having a dopant impurity concentration of $N_1 + N_2$ are produced on the substrate 8, and they are respectively made a photodiode section 10 and a storage section 20, the barrier gate 4 and the storage gate 5 are not required and the element structure can be simplified. Furthermore, because the potentials of the photodiode section 10 and the storage section 20 can always be made constant, respectively, the electrons which are produced by light-electricity conversion at the photodiode section 10 can be stored at the storage section 20 with good linearity.

In constructing an image sensor which conducts a charge storage operation, a device in which charges generated at the photodiode section are stored at a storage section which is provided separately from the photodiode section is constructed as in the above-illustrated embodiment. However, a device in which charges are stored at the photodiode itself can be considered. Such a photodiode storage type solid state imaging element, although it has the advantage that the element can be miniaturized since no storage section is needed, has a disadvantage in that the linearity of the storage charge is reduced especially in devices having a wide dynamic range. That is, in the photodiode storage type solid state imaging element, a reverse bias is applied to the pn junction and signal charges are stored at the depletion layer generated therebelow. When the signal charges increase, the depletion layer is reduced and the efficiency of collecting the signal charges which can be captured by the depletion layer varies, thereby changing the sensitivity from the start of storage and to the conclusion of storage. This means that the linearity of the storage is reduced. In the structure of the present invention, however, since the photodiode section and the storage section are separated from each other, high precision devices are attained relative to photodiode storage type devices.

Figure 2A:
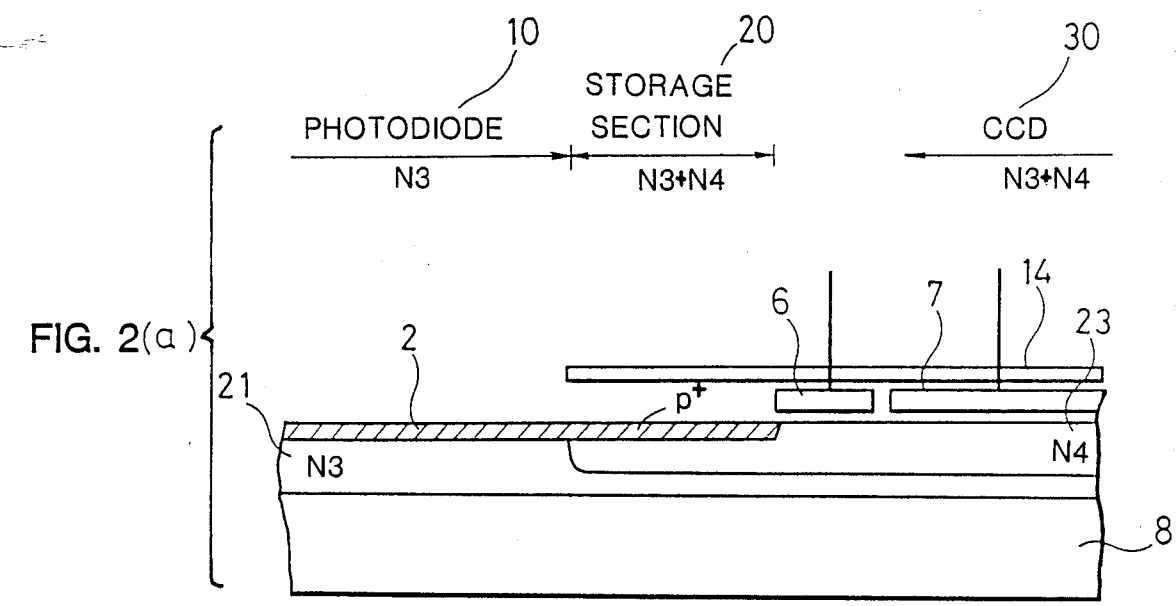
FIG. 2(a) is a cross-sectional view of a solid state imaging element according to a second embodiment of the present invention and FIG. 2(b) is a potential diagram for explaining the operation of the device of FIG. 2(a)
Figure 2B:
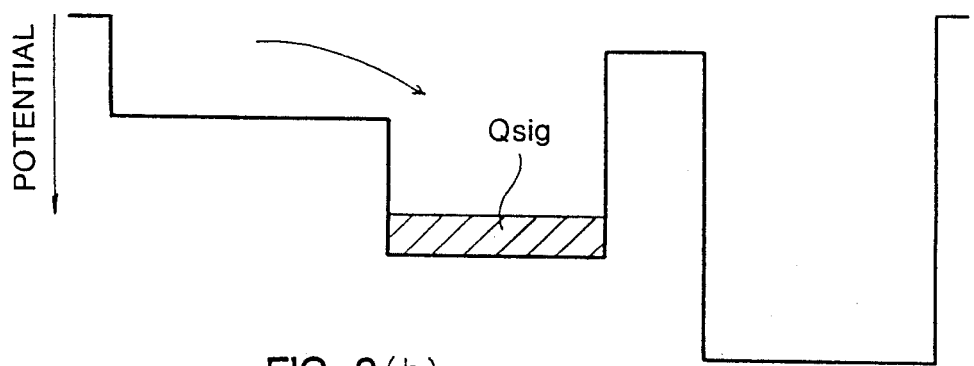

FIG. 2(a) shows a solid state imaging element according to a second embodiment of the present invention and FIG. 2(b) shows a potential diagram for explaining the operation thereof.

Although in the above-illustrated first embodiment the concentration of the N type dopant impurities at the buried channel of CCD 30 is made $N_2$, a structure having a concentration $N_3 + N_4$ of n type dopant impurities for buried channel section 30 and storage portion 20 of the CCD may be adopted as shown in FIG. 2(a).

Also in this second embodiment, the potential of the storage portion 20 is made lower than that of is made lower than that of the photodiode section 10 as shown in FIG. 2(b) and the same functions and effects as the first embodiment can be realized. That is, generation of dark current at the storage section 20 can be reduced.

Figure 3:
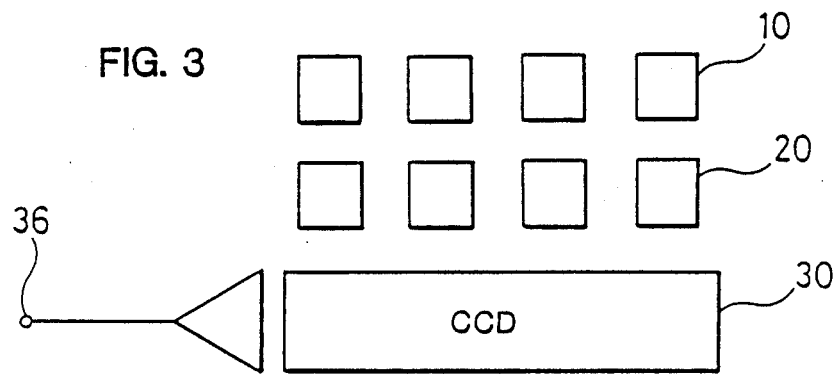
FIG. 3 is a block diagram of a solid state imaging element according to the first and second embodiments of the present invention.

While in the first and second embodiments a CCD 30 is used for reading out signal charges at the storage section 20 and the signal charges are successively read out therefrom as shown in FIG. 3, this reading out means may not be restricted to CCD 30 and a MOSFET transistor switch may be used instead.

Figure 4:
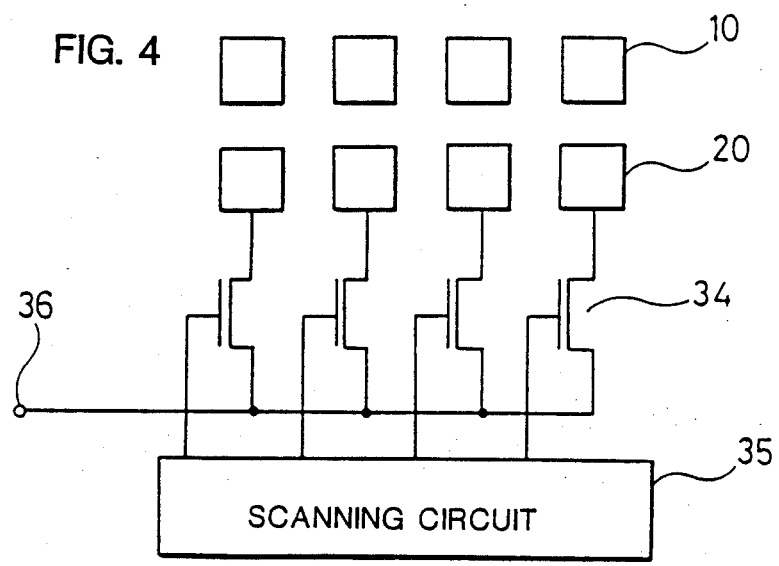
FIG. 4 is a block diagram of a solid state imaging element according to a third embodiment of the present invention.
Figure 5A:
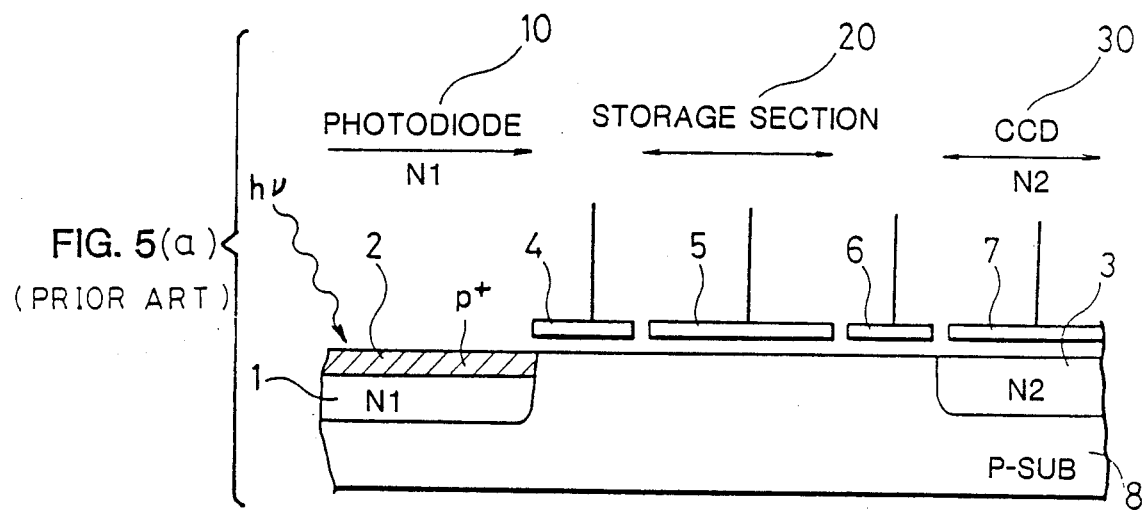
FIG. 5(a) is a cross-sectional view of prior art solid state imaging element and FIG. 5(b) is a potential diagram for explaining the operation of the device of FIG. 5(a).
Figure 5B:
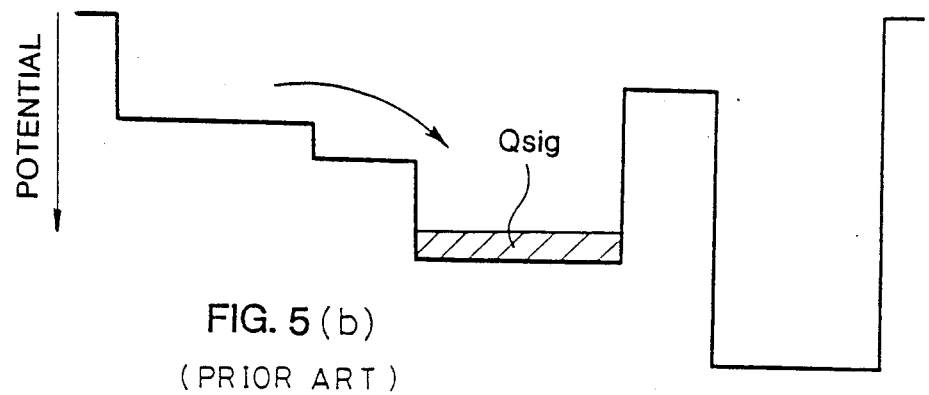

FIG. 4 shows a solid state imaging element according to a third embodiment of the present invention, which uses MOSFET transistor switches 34 in place of the CCD 30 of FIG. 3. Reference numeral 35 designates a scanning circuit and reference numeral 36 designates a signal output terminal. In the image sensor of such a construction, signal charges of the storage section 20 are successively read out by the MOSFET transistor switches 34, and they are successively transferred by the operation of the scanning circuit 35. Also in this embodiment the same effects as the above-illustrated embodiment can be obtained.

As is evident from the foregoing description, according to the present invention, in a solid state imaging element in which a light-electricity conversion section and charge storage section are provided separately from each other, a P+ layer is disposed at the surface of light-electricity conversion section as well as at the surface of storage section, and the light-electricity conversion section and the storage section are buried in a semiconductor substrate. Further, a light shielding film is disposed covering the storage section and the CCD section. By varying the impurity concentrations, the potential of the storage section is made lower than that of light-electricity conversion section. Accordingly, the dark current generated at the surface of the element can be reduced, and signal charges obtained by light-electricity conversion can be read out with high precision, and a good imaging characteristic is obtained.

What is claimed is:

1. A solid state imaging element comprising:
   a first conductivity type semiconductor substrate having a surface;
   a light to electricity conversion section for generating electrical charges in response to light incident on the surface;
   a charge storage section for storing charges generated by the light to electricity conversion section;
   a transfer section for transferring electrical charges stored in said storage section;
   a first second conductivity type region containing dopant impurities and disposed in the substrate underlying the light to electricity and charge storage sections;
   a second second conductivity type region containing dopant impurities and disposed in the substrate underlying the transfer section and the storage section and intersecting the first second conductivity type region at least in the storage section;
   a first conductivity type layer disposed in the substrate at the surface overlying the first and second second conductivity type regions of the light to electricity conversion section and the charge storage section; and
   a light shielding film disposed covering the transfer section and the charge storage section wherein the concentration of the dopant impurities in the second second conductivity type region is higher than the concentration of the dopant impurities in the first second conductivity type region.

2. A solid state imaging element as defined in claim 1 wherein said first conductivity type semiconductor substrate comprises P type silicon.

3. A solid state imaging element as defined in claim 1 wherein said transfer section comprises a Charge Coupled Device.

4. A solid state imaging element as defined in claim 3 wherein the dopant impurity concentration in the first second conductivity type region is $N_1$, the dopant impurity concentration in the second second conductivity type region is $N_2$, and the dopant concentration in the intersection of the regions in the charge storage section is $N_1+N_2$.

5. A solid state imaging element as defined in claim 3 wherein the first and second regions intersect in the transfer storage section and the dopant impurity concentration in the first second conductivity type region is $N_3$, and the dopant impurity concentrations in the charge storage, and transfer sections are $N_3+N_4$.

6. A solid state imaging element as defined in claim 1 wherein said transfer comprises a MOS transistor switch and a scanning circuit.

7. A solid state imaging element as defined in claim 1 wherein said light shielding film comprises aluminum.

8. A solid state imaging element as defined in claim 1 including a plurality of light to electricity conversion sections and a charge storage section for each of said light to electricity conversion sections.

9. A solid state imaging element as defined in claim 8 wherein said light to electricity conversion sections are arranged in a linear array.

10. A solid state imaging element as defined in claim 8 wherein said light to electricity conversion sections are arranged in a two-dimensional array.

* * * * *